(12) United States Patent
Cheng et al.

(10) Patent No.: US 9,024,664 B2
(45) Date of Patent: May 5, 2015

(54) CURRENT-TO-VOLTAGE CONVERTER AND ELECTRONIC APPARATUS THEREOF

(71) Applicant: ILI Technology Corp., Hsinchu County (TW)

(72) Inventors: Chih-Jen Cheng, Hsinchu (TW); Cheng-Chung Hsu, Hsinchu County (TW)

(73) Assignee: ILI Technology Corp., Hsinchu County (TW)

( * ) Notice: Subject to any disclaimer, the term of this patent is extended or adjusted under 35 U.S.C. 154(b) by 0 days.

(21) Appl. No.: 14/018,457

(22) Filed: Sep. 5, 2013

(65) Prior Publication Data

US 2014/0333348 A1 Nov. 13, 2014

(30) Foreign Application Priority Data

May 13, 2013 (TW) .............................. 102116855 A (51) Int. Cl.
*H02M 11/00* (2006.01)
*H03F 3/45* (2006.01)
*H02M 1/00* (2006.01)

(52) U.S. Cl.
CPC ..................................... *H02M 1/00* (2013.01)

(58) Field of Classification Search
CPC .......... G05F 1/10; G05F 1/561; H03F 1/3211
USPC ......................................................... 327/103
See application file for complete search history.

(56) References Cited

U.S. PATENT DOCUMENTS

2007/0247533 A1* 10/2007 Hisamatsu et al. ........... 348/257
2011/0169552 A1* 7/2011 Jeong ............................ 327/512

* cited by examiner

*Primary Examiner* — John Poos
(74) *Attorney, Agent, or Firm* — Li & Cai Intellectual Property (USA) Office (57) ABSTRACT

A current-to-voltage converter which is used to receive an input current and to generate an output voltage accordingly comprises a current tracking bias circuit, a current-to-voltage unit, and a voltage clamp bias circuit. The current tracking bias circuit generates a first bias according to the input current. The current-to-voltage unit receives the first bias and the input current, and generates the output voltage according to the input current, wherein the first bias determines a range of the input current, the current-to-voltage unit has a first current control device, and the first current control device changes a current conduction level thereof in response to the first bias, such that a rising or falling speed of the output voltage is enhanced. The voltage clamp bias circuit clamps voltage levels of two ends where the voltage clamp bias circuit is connected to the current-to-voltage unit.

8 Claims, 7 Drawing Sheets

CURRENT-TO-VOLTAGE CONVERTER AND ELECTRONIC APPARATUS THEREOF

BACKGROUND

1. Technical Field

The present disclosure is related to a current-to-voltage converter, and in particular to, a single stage current-to-voltage converter with a high input range and a wide output swing, and the electronic apparatus using the current-to-voltage converter.

2. Description of Related Art

Currently, an electronic apparatus usually has a current-to-voltage converter, and the current-to-voltage converter can convert the current to the voltage, and transmit the converted voltage to the other function circuit of the electronic apparatus, such that the function circuit can receive the voltage, and execute a corresponding function according to the voltage.

Figure 1:
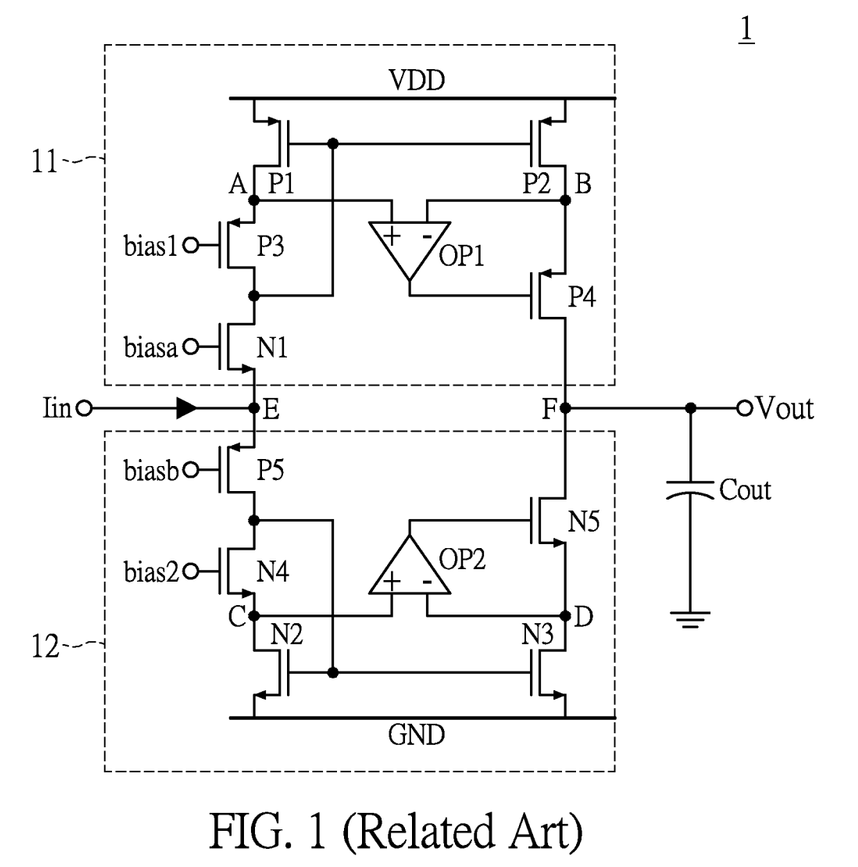
FIG. 1 is circuit diagram of a conventional current-to-voltage converter.

Please refer to FIG. 1, FIG. 1 is circuit diagram of a conventional current-to-voltage converter. The conventional current-to-voltage converter 1 comprises a first current-to-voltage unit 11, a second current-to-voltage unit 12 and an output capacitor Cout, and has an input end at an end E and an output end at an end F. The first current-to-voltage unit 11 and the second current-to-voltage unit 12 are connected to each other through the ends E and F, and thus form a cascode structure. The output capacitor Cout is connected to an output end of the conventional current-to-voltage converter 1 through the end F.

The conventional current-to-voltage converter 1 can receive an input current through an input end thereof, generate the voltage Vout according to the current Iin, and output the voltage Vout through the output end thereof. To put it concretely, the first current-to-voltage unit 11 and the second current-to-voltage unit 12 determine currents flowing inner transistors thereof according to the current Iin, and the currents flowing the inner transistors thereof determine the drain-source voltages of the inner transistors of the first current-to-voltage unit 11 and the second current-to-voltage unit 12, such that the voltage Vout at the output end can be determined.

The first current-to-voltage unit 11 comprises four P-type transistors P1 through P4, an N-type transistor N1, and an operation amplifier OP1. Gates of the P-type transistors P1 and P2 are connected to each other, and further to a drain of the P-type transistor P3. Sources of P-type transistors P1 and P2 are connected to a supply voltage VDD. Through the end A, a positive input end of the operation amplifier OP1 is connected to a drain of the P-type transistor P1 and a source of the P-type transistor P3. Through the end B, a negative input end of the operation amplifier OP1 is connected to a drain of the P-type transistor P2 and a source of the P-type transistor P4. A gate of the P-type transistor P3 is connected to a bias bias1, and an output end of the operation amplifier OP1 is connected to a gate of the P-type transistor P4. A drain of the N-type transistor N1 is connected to a drain of the P-type transistor P3, a gate of the N-type transistor N1 is connected to another bias biasa. A source of the N-type transistor N1 and a drain of the P-type transistor P4 are respectively connected to the ends E and F.

The second current-to-voltage unit 12 comprises four N-type transistors N2 through N5, a P-type transistor P5, and an operation amplifier OP2. Gates of the N-type transistors N2 and N3 are connected to each other, and further to a drain of the N-type transistor N4. Sources of the N-type transistors N1 and N2 are connected to a ground. Through the end C, a positive input end of the operation amplifier OP2 is connected to a drain of the N-type transistor N2 and a source of the N-type transistor N4. Through the end D, a negative input end of the operation amplifier OP2 is connected to a drain of the N-type transistor N3 and a source of the N-type transistor N5. A gate of the N-type transistor N4 is connected a bias bias2, and an output end of the operation amplifier OP2 is connected to gate of the N-type transistor N5. A drain of the P-type transistor P5 is connected to a drain of the N-type transistor N4, and a gate of the P-type transistor P5 is connected to another bias biasb. A source of the P-type transistor P5 and a drain of the N-type transistor N5 are respectively connected to the ends E and F.

In the conventional current-to-voltage converter 1, the biases bias1 and bias2 are respectively used to determine swings of currents generated by the first current-to-voltage unit 11 and the second current-to-voltage unit 12, and the swings of the currents generated by the first current-to-voltage unit 11 and the second current-to-voltage unit 12 determines the swing of voltage Vout. Generally speaking, the bias bias1 and bias2 are fixed biases (i.e. constant voltage), such that when the current Iin is not input to the first current-to-voltage unit 11 and the second current-to-voltage unit 12, the fixed currents flowing the P-type transistors P2, P4, and the N-type transistors N5, N3 are generated. However, since the first current-to-voltage unit 11 and the second current-to-voltage unit 12 are connected in a cascode structure, the gate of N-type transistor N1 and the gate of the P-type transistor P5 should be connected to the biases biasa and biasb, and the input range of the current Iin is limited.

Additionally, the operation amplifier OP1 is used to clamp the voltage levels of the ends A and B at the constant voltage values, and in the similar manner, the operation amplifier OP2 is used to clamp the voltage levels of the ends C and D at the constant voltage values. Accordingly, the operation amplifiers OP1 and OP2 can enhance the output impedance of the output end of the conventional current-to-voltage converter 1, so as to reduce the effect which the leakage current affects the voltage Vout. However, the operation bandwidth of the operation amplifiers OP1 and OP2 may decrease the current tracking speeds of the currents flowing the P-type transistors P2, P4, and the N-type transistors N5, N3, such that the transient speed of the voltage Vout of the output end may be too slow to cause the current-to-voltage (Iin-to-Vout) conversion error, i.e. the rising or falling speed of the currents flowing the P-type transistors P2, P4, and the N-type transistors N5, N3 may be slow unexpectedly, and the rising or falling speed of the voltage Vout is not fast enough.

SUMMARY

An exemplary embodiment of the present disclosure provides a current-to-voltage converter. The current-to-voltage converter is used to receive an input current, and accordingly generates an output voltage. The current-to-voltage converter comprises a current tracking bias circuit, a current-to-voltage unit, and a voltage clamp bias circuit, wherein the current-to-voltage unit is connected to the current tracking bias circuit, and the voltage clamp bias circuit is connected to current-to-voltage unit. The current tracking bias circuit generates a first bias according to the input current. The current-to-voltage unit receives the first bias and the input current, and generates the output voltage according to the input current, wherein the first bias determines a range of the input current, the current-to-voltage unit has a first current control device, and the first current control device changes a current conduction level thereof in response to the first bias, such that a rising or falling speed of the output voltage is enhanced. The voltage clamp bias circuit clamps voltage levels of two ends where the voltage clamp bias circuit is connected to the current-to-voltage unit.

In a preferred exemplary embodiment of the present disclosure, the current tracking bias circuit further generates a second bias according to the input current, and the current-to-voltage unit further receives the second bias. The current-to-voltage unit further has a second current control device, and the second current control device changes a current conduction level thereof according to the second bias to enhance the rising or falling speed of the output voltage. The voltage clamp bias circuit further clamps voltage levels of another two ends where the voltage clamp bias circuit is connected to the current-to-voltage unit, wherein the first bias and the second bias determine the range of the input current.

An exemplary embodiment of the present disclosure provides an electronic apparatus comprising one of the above current-to-voltage converters and a function circuit, wherein the function circuit is connected to the current-to-voltage converter. The function circuit receives the output voltage, and executes a corresponding function accordingly.

To sum up, the current-to-voltage converter provided by the exemplary embodiment of the present disclosure can have the high input range and wide output swing by using the current tracking bias circuit and the voltage clamp bias circuit. In addition, the current-to-voltage unit of the current-to-voltage converter can have the current control device to enhance the rising or falling speed of the output voltage of the current-to-voltage converter. Furthermore, the voltage clamp bias circuit can further maintains the drain-source voltage of the transistor in the current-to-voltage unit with a constant voltage value, so as to reduce the effect which the channel length modulation effect of the transistor affects the output voltage of the current-to-voltage converter.

In order to further understand the techniques, means and effects of the present disclosure, the following detailed descriptions and appended drawings are hereby referred, such that, through which, the purposes, features and aspects of the present disclosure can be thoroughly and concretely appreciated; however, the appended drawings are merely provided for reference and illustration, without any intention to be used for limiting the present disclosure.

BRIEF DESCRIPTION OF THE DRAWINGS

The accompanying drawings are included to provide a further understanding of the present disclosure, and are incorporated in and constitute a part of this specification. The drawings illustrate exemplary embodiments of the present disclosure and, together with the description, serve to explain the principles of the present disclosure.

DESCRIPTION OF THE EXEMPLARY EMBODIMENTS

Reference will now be made in detail to the exemplary embodiments of the present disclosure, examples of which are illustrated in the accompanying drawings. Wherever possible, the same reference numbers are used in the drawings and the description to refer to the same or similar parts.

Exemplary Embodiment of Current-to-Voltage Converter

Figure 2:
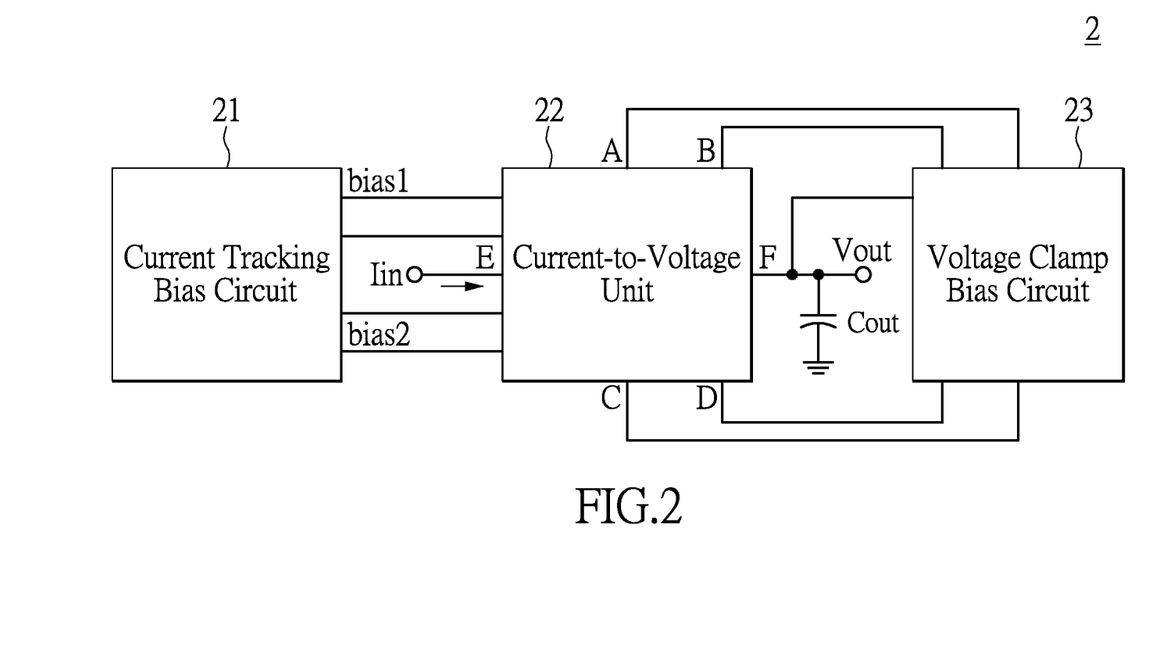
FIG. 2 is a block diagram of a current-to-voltage converter according to an exemplary embodiment of the present disclosure.

Referring to FIG. 2, FIG. 2 is a block diagram of a current-to-voltage converter according to an exemplary embodiment of the present disclosure. The current-to-voltage converter 2 comprises a current tracking bias circuit 21, a current-to-voltage unit 22, a voltage clamp bias circuit 23, and an output capacitor Cout. Two output ends of the current tracking bias circuit 21 are connected to two bias ends of the current-to-voltage unit 22, and two ends of the current tracking bias circuit 21 are connected to two ends of the current-to-voltage unit 22 respectively. The four ends A through D of the current-to-voltage unit 22 are respectively connected to four ends of the voltage clamp bias circuit 23, and another end of the voltage clamp bias circuit 23 is connected to the end F of the current-to-voltage unit 22. An output end of the current-to-voltage converter 2 is located at the end F of the current-to-voltage unit 22, an input end of the current-to-voltage converter 2 is connected to the end E of the current-to-voltage unit 22, and the output capacitor Cout is connected between the end F and the ground.

In the exemplary embodiment, the current tracking bias circuit 21 biases bias1 and bias2 to the current-to-voltage unit 22 according to the current Iin. More specifically, the current tracking bias circuit 21 has a plurality of transistors to from two current mirrors, and is connected to the current-to-voltage unit 22, such that the current tracking bias circuit 21 can generate currents corresponding to the current Iin, and then generate the biases bias1 and bias2 according to the generated currents. Since the biases bias1 and bias2 are generated according to current Iin, the input range of the current Iin input to the current-to-voltage converter 2 can be increased.

Next, the current-to-voltage unit 22 is used to receive the current Iin, and the biases bias1 and bias2 are used to determine the swings of the current generated by the current-to-voltage unit 22. The current-to-voltage unit 22 generates the voltage Vout according to the received current Iin, and output the voltage Vout at the end F. In addition, the current-to-voltage unit 22 has two current control devices (not shown in FIG. 2, but shown in the FIG. 3, the devices CC1 and CC2), and the two control ends of the two current control devices are connected to the biases bias1 and bias2. Furthermore, the first end of one current control device in the current-to-voltage unit 22 is connected to the end B, the first end of the other one current control device in the current-to-voltage unit 22 is connected to the end D, and the second ends of the two current control device are connected to the end F.

The current control device is controlled by the biases bias1 and bias2, and the biases bias1 and bias2 are determined by the current Iin. Thus, when the input current Iin increases the swings of the currents generated by the current-to-voltage unit 22, the variations of the biases bias1 and bias2 are also changed, such that the current control device can increase the rising or falling speed of the currents generated by the current-to-voltage unit 22 to prevent from the current-to-voltage (Iin-to-Vout) conversion error owing to that the rising or falling speed of the voltage Vout cannot keep up with the variation of the current Iin.

To reduce the effect which the leakage current affects the output swing of the voltage Vout, the voltage clamp bias circuit 23 has two operation amplifiers. Two positive input ends of the two operation amplifiers are connected to the ends A, C of the current-to-voltage unit 22, and two negative input ends of the two operation amplifiers are connected to the ends B, D of the current-to-voltage unit 22, such that the voltage level of the ends A through D are clamped at a constant voltage value. Thus, the output impedance of the current-to-voltage converter 2 is increased, and the leakage current is further decreased. Moreover, since the voltage levels of the ends A through D are constant voltage values, the effect owing to channel length modulation effect generated by the transistors of the current-to-voltage unit 22 is also decreased.

By using the current tracking bias circuit 21 and the voltage clamp bias circuit 23, the current-to-voltage converter 2 can have the high input range and wide output swing. Furthermore, by using the current control devices of the current-to-voltage unit 22, the rising or falling speed of the voltage Vout of the output end of the current-to-voltage converter 2 can be further increased to prevent from the current-to-voltage (Iin-to-Vout) conversion error.

Figure 3:
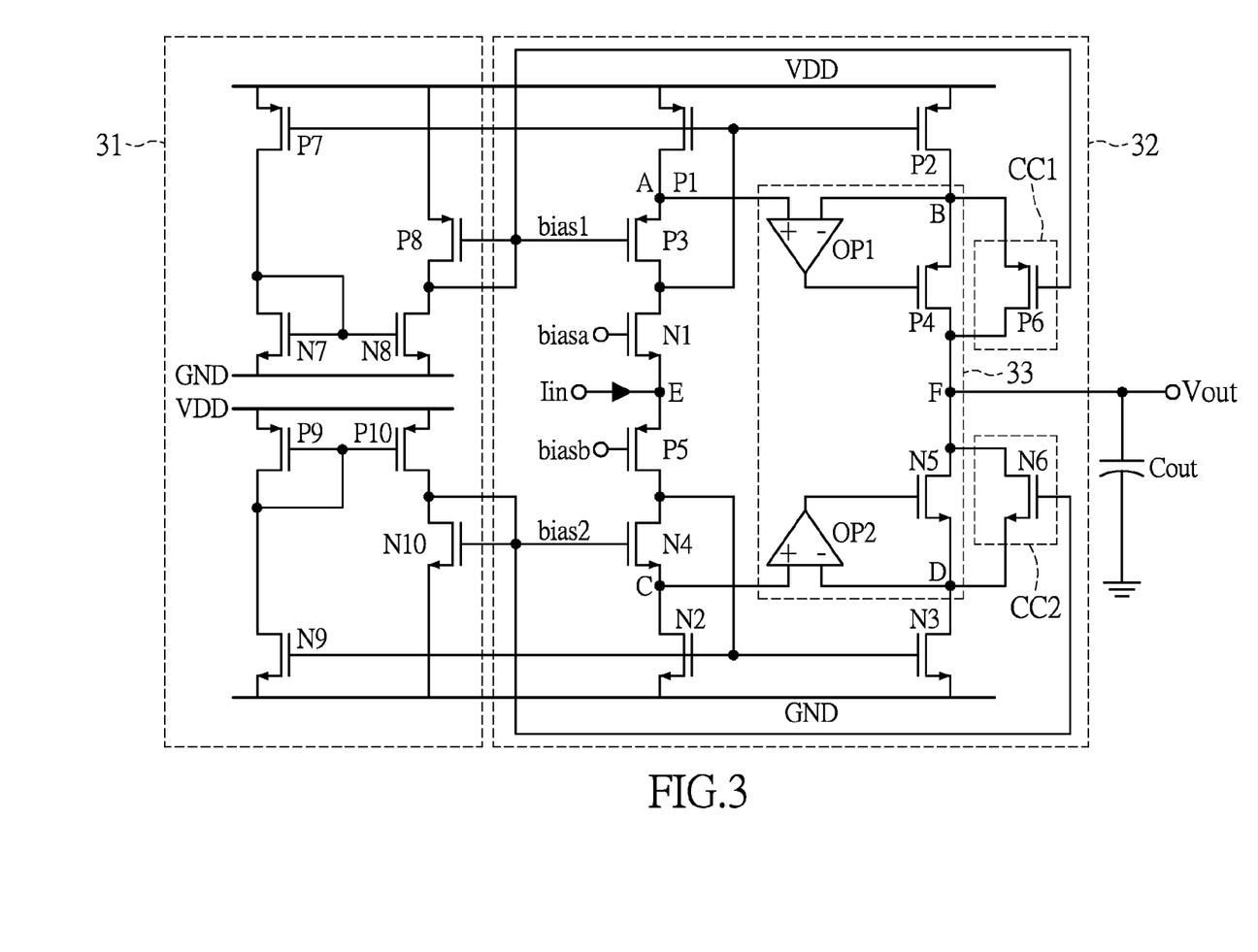
FIG. 3 is a circuit diagram of a current-to-voltage converter according to an exemplary embodiment of the present disclosure.

Please refer FIG. 3. FIG. 3 is a circuit diagram of a current-to-voltage converter according to an exemplary embodiment of the present disclosure. The current-to-voltage converter 3 in FIG. 3 is one implementation of the current-to-voltage converter 2 in FIG. 2, but the present disclosure does not limit the implementation of the current-to-voltage converter 2 in FIG. 2. The current-to-voltage converter 3 comprises a current tracking bias circuit 31, a current-to-voltage unit 32, a voltage clamp bias circuit 33, and an output capacitor Cout. The functions and connections of the current tracking bias circuit 31, the current-to-voltage unit 32, the voltage clamp bias circuit 33, and the output capacitor Cout are similar to those of the current tracking bias circuit 21, the current-to-voltage unit 22, the voltage clamp bias circuit 23, and the output capacitor Cout, and thus the redundant description is omitted.

The current tracking bias circuit 31 comprises two current mirrors, wherein one current mirror comprises two P-type transistors P7, P8, and two N-type transistors N7, N8, and the other one current mirror comprises two P-type transistors P9, P10, and two N-type transistors N9, N10. The current-to-voltage unit 32 comprise four P-type transistors P1 through P3, P5, four N-type transistors N1 through N4, and two current control devices CC1, CC2, wherein the current control devices CC1 and CC2 are respectively implemented by the P-type transistor P6 and the N-type transistor N6. The voltage clamp bias circuit 33 comprises two operation amplifiers OP1, OP2, a P-type transistor P4, and an N-type transistor N5. It is noted that the implementation of the current control devices CC1 and CC2 does not limit the present disclosure, and the other components capable of controlling the current conduction levels thereof can be used to implement the current control devices CC1 and CC2.

Sources of the P-type transistors P7, P8 are connected to the supply voltage VDD, gates of the N-type transistors N7 and N8 are connected to each other, and sources of the N-type transistors N7 and N8 are connected to the ground GND. A drain of the P-type transistor P7 is connected to gates of the N-type transistors N7, N8, and a drain of the N-type transistor N7, and a gate of the P-type transistor P7 is connected to gates of the P-type transistors P1, P2. A gate of the P-type transistor P8 is connected to gates of the P-type transistors P3, P6, and a drain of the P-type transistor P8, and a drain of the N-type transistor N8 is connected to a drain of the P-type transistor P8.

Sources of the P-type transistors P9 and P10 are connected to the supply voltage VDD, gates of the P-type transistors P9 and P10 are connected to each other, and sources of the N-type transistors N9 and N10 are connected to the ground GND. A drain of the N-type transistor N9 is connected to gates of the P-type transistors P9, P10, and a drain of the P-type transistor P9, a gate of the N-type transistor N9 is connected to gates of the N-type transistors N2, N3. A gate of the N-type transistor N10 is connected to gates of the N-type transistors N4, N6, and a drain of the N-type transistor N10, and a drain of the P-type transistor P10 is connected to a drain of the N-type transistor N10.

Sources of the P-type transistors P1, P2 are connected to the supply voltage VDD, and gates of the P-type transistors P1, P2 are connected to each other, and further to a drain of the P-type transistor P3. Through the end A, a drain of the P-type transistor P1 is connected to a positive input end of the operation amplifier OP1 and a source of the P-type transistor P3. A drain of the N-type transistor N1 is connected to a drain of the P-type transistor P3, a gate of the N-type transistor N1 is connected to the bias biasa, and a source of the N-type transistor N1 is connected to the end E. Through the end B, a drain of the P-type transistor P2 is connected to a negative input end of the operation amplifier OP1 and sources of the P-type transistors P4, P5. An output end of the operation amplifier OP1 is connected to a gate of the P-type transistor P4, and drains of the P-type transistors P4, P5 are connected to the end F.

Sources of the N-type transistors N2, N3 are connected the ground GND, and gates of the N-type transistors N2, N3 are connected to each other, and further to a drain of the N-type transistor N4. Through the end C, a drain of the N-type transistor N2 is connected to a positive input end of the operation amplifier OP2 and a source of the N-type transistor N4. A drain of the P-type transistor P5 is connected to a drain of the N-type transistor N4, a gate of the P-type transistor P5 is connected to the bias biasb, and a source of the P-type transistor P5 is connected to the end E. Through the end D, a drain of the N-type transistor N3 is connected to a negative end of the operation amplifier OP2 and sources of the N-type transistors N5, N6. An output end of the operation amplifier OP2 is connected to a gate of the N-type transistor N5, and drains of the N-type transistors N5, N6 are connected to the end F.

Based upon the above architecture, the current mirror formed by the P-type transistors P7, P8, and the N-type transistors N7, N8 can mirror the input current Iin to generate the current corresponding to the current Iin, and generate the bias bias1 to the gate of the P-type transistors P3 and P5 according to the generated current. In the similar manner, the current mirror formed by the P-type transistors P9, P10, and the N-type transistors N9, N10 can mirror the input current to generate the current corresponding to the current Iin, and generate the bias bias2 to the gate of the N-type transistors N4 and N5 according to the generated current.

Moreover, the operation amplifier OP1 is used to clamp the voltage levels of the ends A and B, and the operation amplifier OP2 to clamp the voltage levels of the ends C and D, so as to reduce the effect which the leakage current affects the output swing of the voltage Vout. Additionally, since the voltages of the ends A through D are fixed, the drain-source voltages of the P-type transistors P1, P2, and the N-type transistors N2, N3 are also fixed, such that the effect which the channel length modulation effect affects the voltage Vout output by the current-to-voltage converter 3 can be reduced. Furthermore, the P-type transistor P6 and the N-type transistor N6 are controlled by the biases bias1 and bias2, the biases bias1 and bias2 are generated according to the current Iin, and thus current conduction levels of the P-type transistor P6 and the N-type transistor N6 are changed in response to the current Iin, so as to increase the rising or falling speed of the voltage Vout.

Another Exemplary Embodiment of Current-to-Voltage Converter

Figure 4:
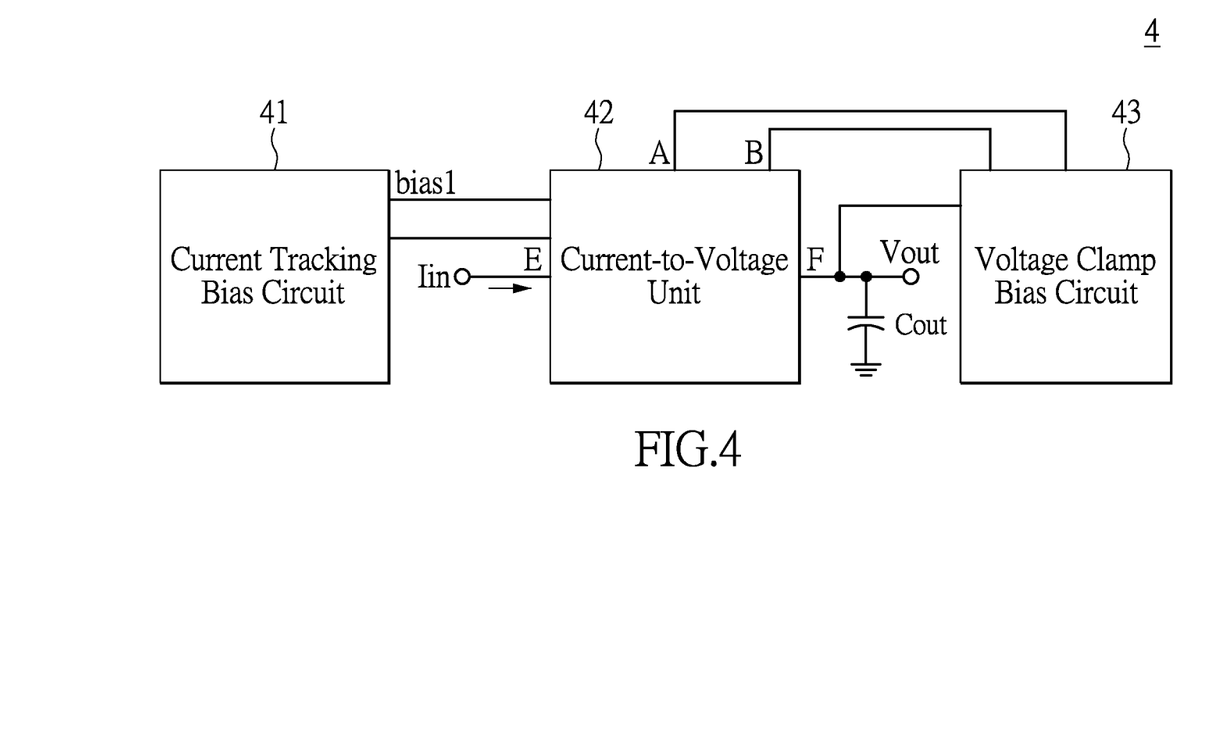
FIG. 4 is a block diagram of a current-to-voltage converter according to another exemplary embodiment of the present disclosure.

Referring to FIG. 4, FIG. 4 is a block diagram of a current-to-voltage converter according to another exemplary embodiment of the present disclosure. The current-to-voltage converter 4 comprises a current tracking bias circuit 41, a current-to-voltage unit 42, a voltage clamp bias circuit 43, and an output capacitor Cout. The exemplary embodiment of FIG. 4 is mostly similar to the exemplary embodiment of FIG. 2, and thus merely the differences between the exemplary embodiments of FIG. 2 and FIG. 4 are illustrated as follows. The current tracking bias circuit 41 merely has one output end connected to a bias end of the current-to-voltage unit 42, and one end of the current tracking bias circuit 41 is connected to one end of the current-to-voltage unit 42. Two ends A, B of the current-to-voltage unit 42 are connected to two ends of the voltage clamp bias circuit 43. The current tracking bias circuit 41 can merely generate the bias bias1 to the current-to-voltage unit 42 according to the current Iin, and the current tracking bias circuit 21 has a plurality of transistors to form a current mirror. The voltage clamp bias circuit 43 merely clamps the voltage levels of the ends A and B. Furthermore, the current-to-voltage unit 42 merely has one current control device (not shown in FIG. 4, but shown in FIG. 5 or FIG. 6, the component CC1 or CC2), and the control end of the current control device is connected to the bias bias1, wherein the first end and the second end of the current control device are connected to the ends B and F respectively.

Figure 5:
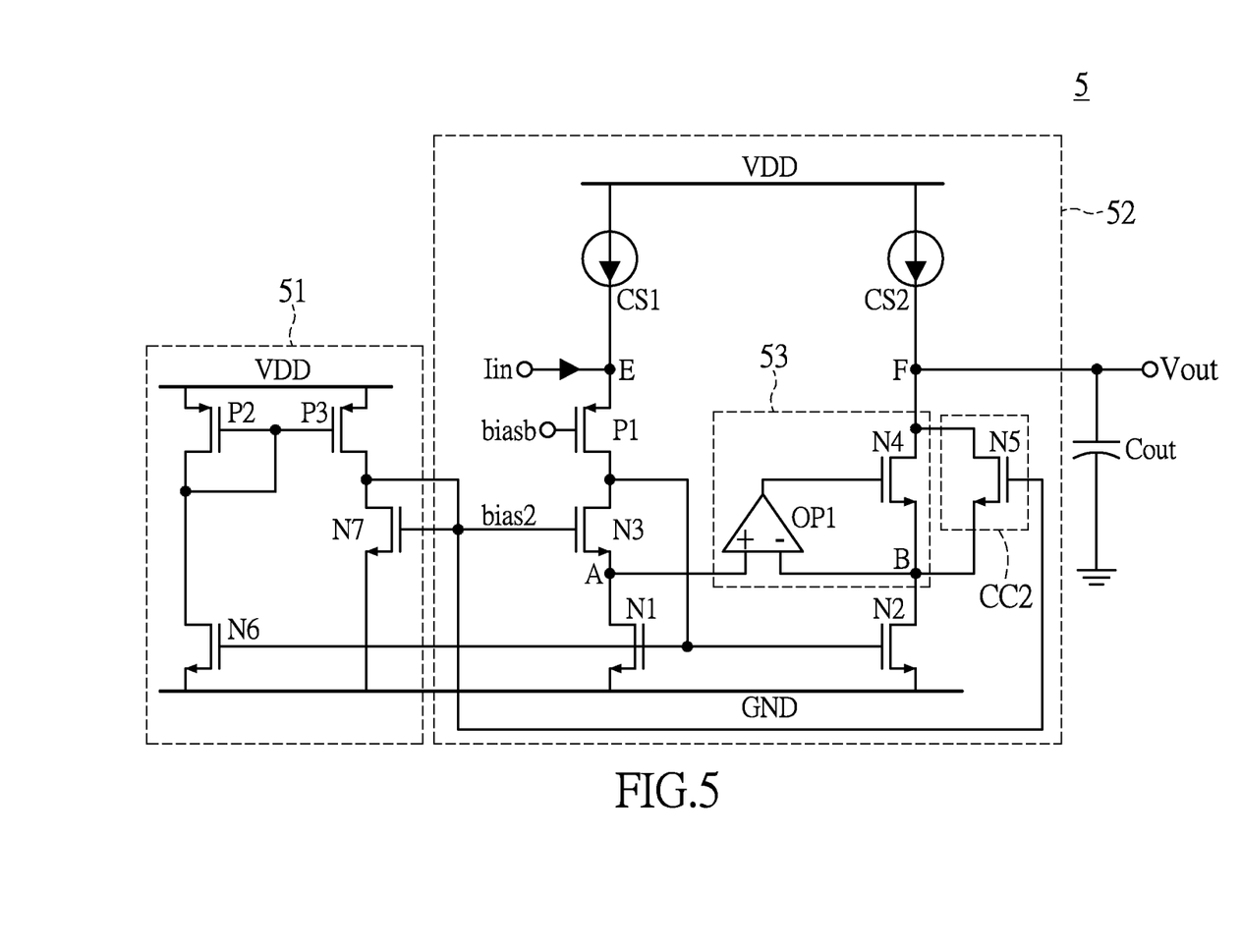
FIG. 5 is a circuit diagram of a current-to-voltage converter according to another exemplary embodiment of the present disclosure.

Next, referring to FIG. 5, FIG. 5 is a circuit diagram of a current-to-voltage converter according to another exemplary embodiment of the present disclosure. The current-to-voltage converter 5 in FIG. 5 is one implementation of the current-to-voltage converter 4 in FIG. 4, but the present disclosure does not limit the implementation of the current-to-voltage converter 4 in FIG. 4. The current-to-voltage converter 5 comprises a current tracking bias circuit 51, a current-to-voltage unit 52, a voltage clamp bias circuit 53, and an output capacitor Cout. The functions and connections of the current tracking bias circuit 51, the current-to-voltage unit 52, voltage clamp bias circuit 53, and the output capacitor Cout are similar to those of the current tracking bias circuit 41, the current-to-voltage unit 42, the voltage clamp bias circuit 43, and the output capacitor Cout. Thus, the redundant description is omitted.

The current tracking bias circuit 51 comprises two P-type transistors P2, P3, and two N-type transistors N6, N7 to form a current mirror. The current-to-voltage unit 52 comprises two current sources CS1, CS2, a P-type transistor P1, three N-type transistors N1 through N3, and a current control device CC2, wherein the current control device CC2 is implemented by an N-type transistor N5. The voltage clamp bias circuit 53 comprises an operation amplifier OP1 and an N-type transistor N4. It is noted that, the implementation of the current control device CC2 is not used to limit the present disclosure, and the other component capable of controlling the current conduction level thereof can be used to implement the current control device CC2.

Sources of the P-type transistors P2 and P3 are connected to the supply voltage VDD, gates of the P-type transistors P2 and P3 are connected to each other, and sources of the N-type transistors N6 and N7 are connected to the ground GND. A drain of the N-type transistor N6 is connected to gates of the P-type transistors P2, P3, and a drain of the P-type transistor P2, and a gate of the N-type transistor N6 is connected to gates of the N-type transistors N1, N2. A gate of the N-type transistor N7 is connected to gates of the N-type transistors N3, N5, and a drain of the N-type transistor N7, and a drain of the P-type transistor P3 is connected to a drain of the N-type transistor N7.

Sources of the N-type transistors N1, N2 are connected to the ground GND, and gates of the N-type transistors N1, N2 are connected to each other, and further to a drain of the N-type transistor N3. Through the end A, a drain of the N-type transistor N1 is connected to a positive input end of the operation amplifier OP1 and a source of the N-type transistor N3. A drain of the P-type transistor P1 is connected to a drain of the N-type transistor N3, a gate of the P-type transistor P1 is connected to bias biasb, and a source of the P-type transistor P1 is connected to the end E. Through the end B, a drain of the N-type transistor N2 is connected to a negative input end of the operation amplifier OP1 and sources of the N-type transistors N4, and N5. An output end of the operation amplifier OP1 is connected to a gate of the N-type transistor N4, and drains of the N-type transistors N4, N5 are connected to the end F. One end of the current source CS1 is connected to the supply voltage VDD, and the other one end of the current source CS1 is connected to the end E. One end of the current source CS2 is connected to the supply voltage VDD, and the other one end of the current source CS2 is connected to the end F.

Based upon the above architecture, the current mirror formed by the P-type transistors P2, P3, and the N-type transistors N6, N7 can mirror the input current Iin to generate the current corresponding to the current Iin, and generate the bias bias1 to the gates of the N-type transistors N3 and N5 according to the generated current.

Additionally, the operation amplifier OP1 is used to clamp the voltage levels of the ends A and B, so as to reduce the effect which the leakage current affects the output swing of the voltage Vout. Additionally, since the voltages of the ends A and B are fixed, the drain-source voltages of the N-type transistors N1, N2 are also fixed, such that the effect which the channel length modulation effect affects the voltage Vout output by the current-to-voltage converter 5 can be reduced. Furthermore, the N-type transistor N5 is controlled by the bias bias1, the bias bias1 is generated according to the current Iin, and thus current conduction level of the N-type transistor N5 is changed in response to the current Iin, so as to increase the rising or falling speed of the voltage Vout.

Figure 6:
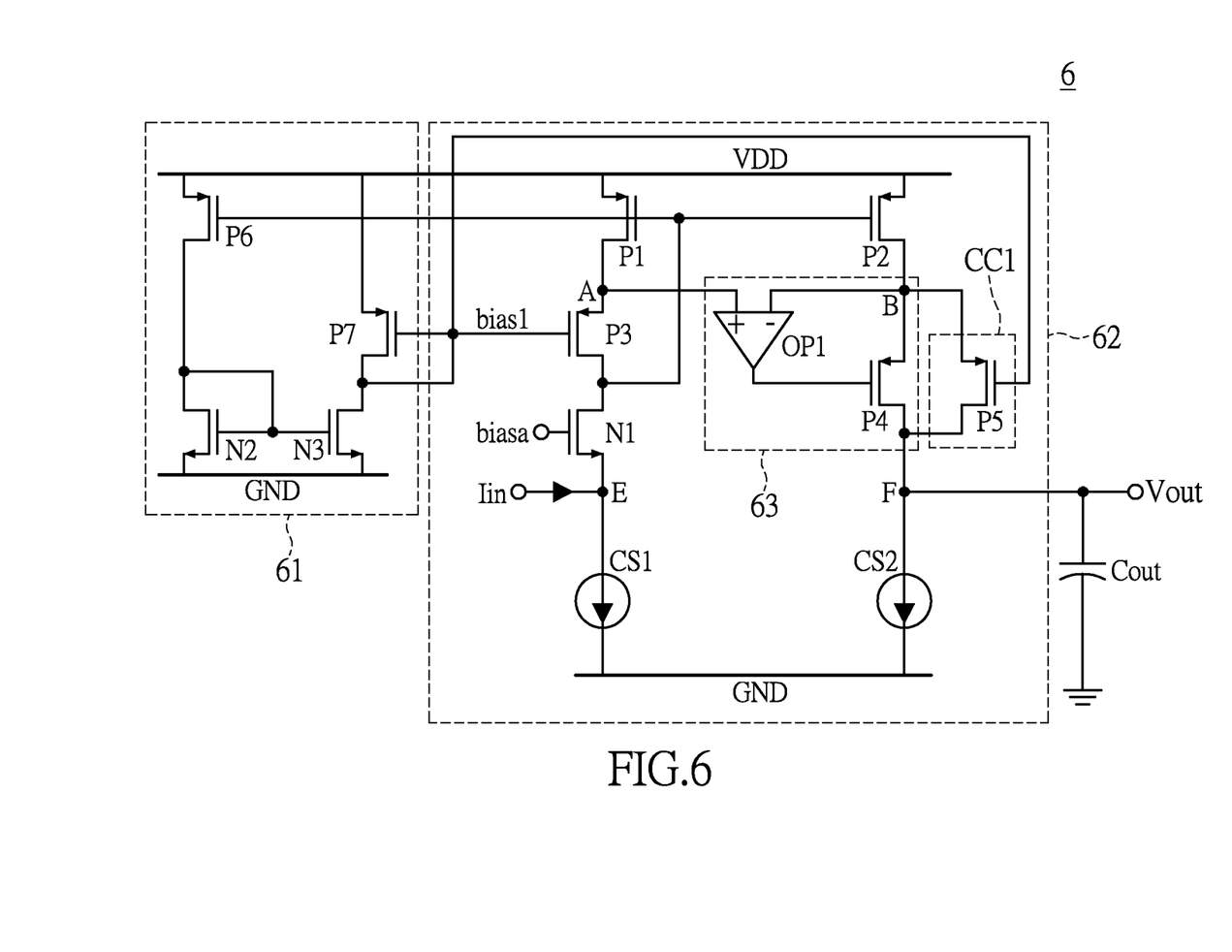
FIG. 6 is a circuit diagram of a current-to-voltage converter according to another exemplary embodiment of the present disclosure.

Then, please refer FIG. 6. FIG. 6 is a circuit diagram of a current-to-voltage converter according to another exemplary embodiment of the present disclosure. The current-to-voltage converter 6 in FIG. 6 is one implementation of the current-to-voltage converter 4 in FIG. 4, but the present disclosure does not limit the implementation of the current-to-voltage converter 4 in FIG. 4. The current-to-voltage converter 6 comprises a current tracking bias circuit 61, a current-to-voltage unit 62, a voltage clamp bias circuit 63, and an output capacitor Cout. The functions and connections of the current tracking bias circuit 61, the current-to-voltage unit 62, the voltage clamp bias circuit 63, and the output capacitor Cout are similar to those of the current tracking bias circuit 41, the current-to-voltage unit 42, the voltage clamp bias circuit 43, and the output capacitor Cout. Thus, the redundant description is omitted.

The current tracking bias circuit 61 comprises two P-type transistors P6, P7, and two N-type transistors N2, N3, to form a current mirror. The current-to-voltage unit 62 comprises two current sources CS1, CS2, an N-type transistor N1, three P-type transistors P1 through P3, and a current control device CC1, wherein the current control device CC1 is implemented by a P-type transistor P5. The voltage clamp bias circuit 63 comprises an operation amplifier OP1 and a P-type transistor P4. It is noted that, the implementation of the current control device CC1 is not used to limit the present disclosure, and the other component capable of controlling the current conduction level thereof can be used to implement the current control device CC1.

Sources of the N-type transistors N2 and N3 are connected to the ground GND, gates of the N-type transistors N2 and N3 are connected to each other, and sources of the P-type transistors P6 and P7 are connected to the supply voltage VDD. A drain of the P-type transistor P6 is connected to gates of the N-type transistors N2, N3 and a drain of the N-type transistor N2, and a gate of the P-type transistor P6 is connected to gates of the P-type transistors P1 and P2. A gate of the P-type transistor P7 is connected to gates of the P-type transistors P3, P5, and a drain of the P-type transistor P7, and a drain of the -type transistor N3 is connected to a drain of the P-type transistor P7.

Sources of the P-type transistors P1, P2 are connected to the supply voltage VDD, and gates of the P-type transistors P1 and P2 are connected to each other, and further to a drain of the P-type transistor P3. Through the end A, a drain of the P-type transistor P1 is connected to a positive input end of the operation amplifier OP1 and a source of the P-type transistor P3. A drain of the N-type transistor N1 is connected to a drain of the P-type transistor P3, a gate of the N-type transistor N1 is connected to bias biasa, and a source of the N-type transistor N1 is connected to the end E. Through the end B, a drain of the P-type transistor P2 is connected to a negative input end of the operation amplifier OP1 and sources of the P-type transistors P4, P5. An output end of the operation amplifier OP1 is connected to a gate of the P-type transistor P4, and drains of the P-type transistors P4, P5 are connected to the end F. One end of the current source CS1 is connected to the ground GND, and the other one end of the current source CS1 is connected to the end E. One end of the current source CS2 is connected to the ground GND and the other one end of the current source CS2 is connected to the end F.

Based upon the above architecture, the current mirror formed by the P-type transistors P6, P7, and the N-type transistors N2, N3 can mirror the input current Iin to generate the current corresponding to the current Iin, and generate the bias bias1 to the gates of the P-type transistors P3 and P5 according to the generated current.

Additionally, the operation amplifier OP1 is used to clamp the voltage levels of the ends A and B, so as to reduce the effect which the leakage current affects the output swing of the voltage Vout. Additionally, since the voltages of the ends A and B are fixed, the drain-source voltages of the P-type transistors P1, P2 are also fixed, such that the effect which the channel length modulation effect affects the voltage Vout output by the current-to-voltage converter 6 can be reduced. Furthermore, the P-type transistor P5 is controlled by the bias bias1, the bias bias1 is generated according to the current Iin, and thus current conduction level of the P-type transistor P5 is changed in response to the current Iin, so as to increase the rising or falling speed of the voltage Vout.

Exemplary Embodiment of Electronic Apparatus

Figure 7:
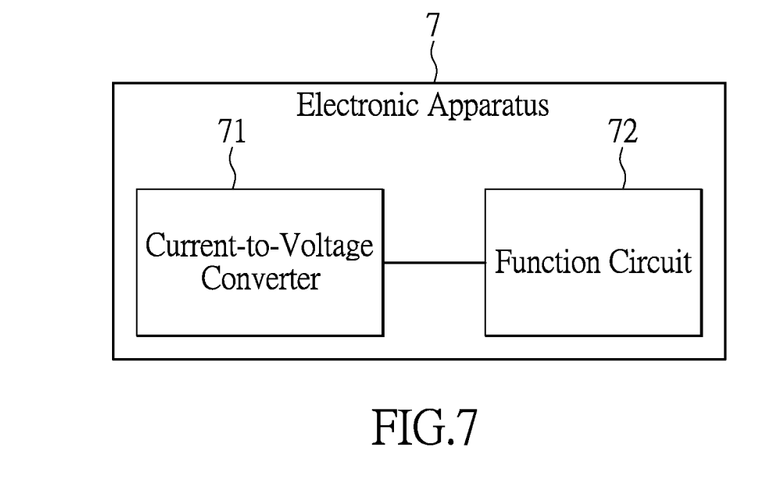
FIG. 7 is a block diagram of an electronic apparatus according to an exemplary embodiment of the present disclosure.

Please refer FIG. 7. FIG. 7 is a block diagram of an electronic apparatus according to an exemplary embodiment of the present disclosure. The electronic apparatus 7 comprises a current-to-voltage converter 71 and a function circuit 72, wherein the current-to-voltage converter 71 is connected to the function circuit 72, and the current-to-voltage converter 71 can be one of the current-to-voltage converters in the exemplary embodiments of the present disclosure or the modification. The current-to-voltage converter 71 is used to receive the current Iin, and output the voltage Vout to the function circuit 72 accordingly. The function circuit can execute the corresponding function according to the received voltage Vout. The electronic apparatus 7 is for example the touch control device, and the function circuit 72 is for example the touch control sensing circuit. However, it is noted that the number and the type of the above function circuit 72 are corresponding to the type of the electronic apparatus 7, and the type of the electronic apparatus is not used to limit the present disclosure.

Possible Result of Exemplary Embodiment

To sum up, he current-to-voltage converter provided by the exemplary embodiment of the present disclosure can have the high input range and wide output swing by using the current tracking bias circuit and the voltage clamp bias circuit. In addition, the current-to-voltage unit of the current-to-voltage converter can have the current control device to enhance the rising or falling speed of the output voltage of the current-to-voltage converter. Furthermore, the voltage clamp bias circuit can further maintains the drain-source voltage of the transistor in the current-to-voltage unit with a constant voltage value, so as to reduce the effect which the channel length modulation effect of the transistor affects the output voltage of the current-to-voltage converter.

The above-mentioned descriptions represent merely the exemplary embodiment of the present disclosure, without any intention to limit the scope of the present disclosure thereto. Various equivalent changes, alternations or modifications based on the claims of present disclosure are all consequently viewed as being embraced by the scope of the present disclosure.

What is claimed is:

1. A current-to-voltage converter, for receiving an input current, and accordingly generating an output voltage, comprising:

a current tracking bias circuit, for generating a first bias according to the input current;

a current-to-voltage unit, connected to the current tracking bias circuit, having a plurality of transistors and two current sources, for receiving the input current and the first bias, and generating the output voltage according to the input current, wherein the first bias determines a range of the input current, and the current-to-voltage unit further has a first current control device, and the first current control device changes a current conduction level thereof in response to the first bias, such that a rising or falling speed of the output voltage is enhanced; and a voltage clamp bias circuit, connected to the current-to-voltage unit, for clamping voltage levels of two ends where the voltage clamp bias circuit is connected to the current-to-voltage unit.

2. The current-to-voltage converter according to claim 1, wherein the current tracking bias circuit further has a current mirror for mirroring the input current to generate the first bias accordingly.

3. The current-to-voltage converter according to claim 1, wherein the voltage clamp bias circuit has an operation amplifier and a transistor.

4. The current-to-voltage converter according to claim 1, wherein the first current control device comprises a transistor.

5. An electronic apparatus, comprising:
a current-to-voltage converter, for receiving an input current, and accordingly generating an output voltage, comprising:
a current tracking bias circuit, for generating a first bias according to the input current;
a current-to-voltage unit, connected to the current tracking bias circuit, having a plurality of transistors and two current sources, for receiving the input current and the first bias, and generating the output voltage according to the input current, wherein the first bias determines a range of the input current, and the current-to-voltage unit further has a first current control device, and the first current control device changes a current conduction level thereof in response to the first bias, such that a rising or falling speed of the output voltage is enhanced; and
a voltage clamp bias circuit, connected to the current-to-voltage unit, for clamping voltage levels of two ends where the voltage clamp bias circuit is connected to the current-to-voltage unit; and
a function circuit, connected to the current-to-voltage converter, for receiving the output voltage, and executing a corresponding function accordingly.

6. The electronic apparatus according to claim 5, wherein the current tracking bias circuit further has a current mirror for mirroring the input current to generate the first bias accordingly.

7. The electronic apparatus according to claim 5, wherein the voltage clamp bias circuit has an operation amplifier and a transistor.

8. The electronic apparatus according to claim 5, wherein the first current control device comprises a transistor.

* * * * *